US007074647B2

(12) United States Patent
Owens et al.

(10) Patent No.: US 7,074,647 B2
(45) Date of Patent: Jul. 11, 2006

(54) SEMICONDUCTOR COMPONENT COMPRISING LEADFRAME, SEMICONDUCTOR CHIP AND INTEGRATED PASSIVE COMPONENT IN VERTICAL RELATIONSHIP TO EACH OTHER

(75) Inventors: Norman L. Owens, Sun Lakes, AZ (US); Darrel Frear, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/615,055

(22) Filed: Jul. 7, 2003

(65) Prior Publication Data

US 2005/0006730 A1 Jan. 13, 2005

(51) Int. Cl.
*H01L 21/44* (2006.01)
*H01L 21/48* (2006.01)

(52) U.S. Cl. .................................. 438/108; 438/109
(58) Field of Classification Search ................ 438/108, 438/109; 257/685, 686, 777, 778
See application file for complete search history.

(56) References Cited

U.S. PATENT DOCUMENTS 5,012,386 A    4/1991   McShane et al. .......... 361/715
5,200,362 A    4/1993   Lin et al. ...................... 29/841
5,311,057 A    5/1994   McShane .................... 257/676
6,133,637 A *  10/2000  Hikita et al. ................ 257/777
6,143,981 A    11/2000  Glenn ........................ 174/52.4
6,175,157 B1 * 1/2001   Morifuji ..................... 257/777
6,281,568 B1   8/2001   Glenn et al. ................ 257/684
6,507,120 B1 * 1/2003   Lo et al. ..................... 257/778
6,555,917 B1   4/2003   Heo ............................ 257/777

* cited by examiner

*Primary Examiner*—Hung Vu
(74) *Attorney, Agent, or Firm*—Bryan Cave LLP

(57) ABSTRACT

In one embodiment of the invention, a semiconductor component includes: a leadframe (110, 210, 310, 410) having a surface (111, 211, 311, 411); an integrated passive component (120, 220, 320, 420) located above the surface of the leadframe; a semiconductor chip (130, 230, 330, 430) electrically coupled to the integrated passive component and located above the surface of the leadframe; and a mold compound (140, 240, 340, 440) disposed around the semiconductor chip, the integrated passive component, and the leadframe. A portion (112, 212, 312, 412) of the leadframe is exposed outside of the mold compound. The integrated passive component comprises a passive device (121, 221, 321, 421). A direction (190, 290, 390, 490) perpendicular to the surface of the leadframe is a vertical direction, and the semiconductor chip, the integrated passive component, and the leadframe are arranged vertically with respect to each other.

15 Claims, 3 Drawing Sheets

SEMICONDUCTOR COMPONENT COMPRISING LEADFRAME, SEMICONDUCTOR CHIP AND INTEGRATED PASSIVE COMPONENT IN VERTICAL RELATIONSHIP TO EACH OTHER

FIELD OF THE INVENTION

This invention relates generally to semiconductor components, and relates more particularly to passive devices in semiconductor packages.

BACKGROUND OF THE INVENTION

Semiconductor chips are often combined with one or more discrete passive devices in a functional leadframe package. In general, increasing the number of discrete passive devices increases the functionality of the leadframe package. However, placing numerous discrete devices across the terminals of a leadframe can be very costly because it can require, at minimum, a larger package that takes a relatively large amount of space on a circuit board and a relatively expensive, high input/output (I/O) package type. Additionally, increasing the number of discrete passive devices increases the opportunity for error and can significantly increase overall component costs. Accordingly, there exists a need for a relatively inexpensive, low I/O semiconductor leadframe package having multiple passive components for increased functionality.

BRIEF DESCRIPTION OF THE DRAWINGS

The invention will be better understood from a reading of the following detailed description, taken in conjunction with the accompanying figures in the drawings in which.

Figure 1:
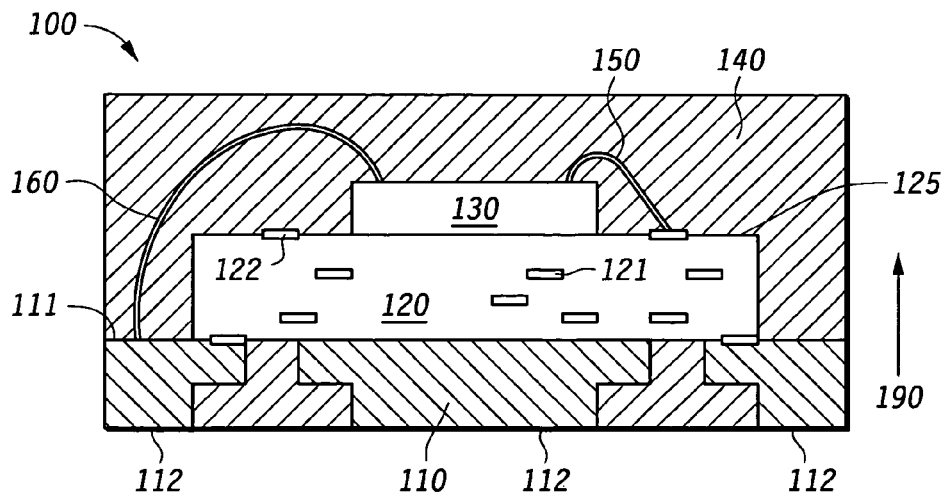
FIG. 1 is a cross-sectional view of a semiconductor component according to an embodiment of the invention.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner.

DETAILED DESCRIPTION OF THE DRAWINGS

In one embodiment of the invention, a semiconductor component comprises: a leadframe having a surface; an integrated passive component located above the surface of the leadframe; a semiconductor chip electrically coupled to the integrated passive component and located above the surface of the leadframe; and a mold compound disposed around the semiconductor chip, the integrated passive component, and the leadframe. A portion of the leadframe is exposed outside of the mold compound. The integrated passive component comprises at least one passive device. A direction perpendicular to the surface of the leadframe is a vertical direction, and the semiconductor chip, the integrated passive component, and the leadframe are arranged vertically with respect to each other.

Referring now to the figures, FIG. 1 is a cross-sectional view of a semiconductor component 100 according to an embodiment of the invention. Semiconductor component 100 comprises a leadframe 110 having a surface 111, an integrated passive component 120 located above surface 111, a semiconductor chip 130 electrically coupled to integrated passive component 120 and located above surface 111, and a mold compound 140 disposed around semiconductor chip 130, integrated passive component 120, and leadframe 110. Integrated passive component 120 is located between leadframe 110 and semiconductor chip 130. A portion 112 of leadframe 110 is exposed outside of mold compound 140. Portion 112 can be used to electrically couple semiconductor component 100 to another semiconductor component, a printed circuit board, or the like. As an example, integrated passive component 120 can comprise silicon, gallium arsenide, silicon germanium, ceramic, glass, organic polymer, or the like. As a particular example, the organic polymer can be a laminated organic structure such as a printed circuit board.

As an example, leadframe 110 can be a quad flat non-leaded leadframe. As other examples, leadframe 110 can be a plastic dual in-line package (P-DIP), a small outline integrated circuit (SOIC), a quad flat pack (QFP), or the like. Integrated passive component 120 comprises a passive device 121. As an example, passive device 121 can be a resistor, a capacitor, an inductor, a passive circuit, a band pass filter, or the like. In one embodiment, integrated passive component 120 comprises a multilayered structure having copper tracings forming a plurality of passive devices, including passive device 121. The manufacture of passive devices within an integrated passive component is well known in the art, and will not be further discussed herein. Semiconductor chip 130, integrated passive component 120, and leadframe 110 are arranged vertically with respect to each other, where a vertical direction 190 is defined as being substantially perpendicular to surface 111.

In one embodiment, passive device 121 may be situated such that passive device 121 is not exposed at any surface of integrated passive component 120. In another embodiment, passive device 121 may be situated such that passive device 121 is exposed at a surface of integrated passive component 120. In the same or another embodiment, integrated passive component 120 can comprise a plurality of passive devices, including passive device 121. In the embodiment illustrated in FIG. 1, passive device 121 is not exposed at any surface of integrated passive component 120, while a passive device 122 is exposed at a surface 125 of integrated passive component 120. Additional discrete passive devices may be placed on integrated passive component 120 and/or on one or more of the electrical interconnects of leadframe 110. It will be understood that the discrete passive devices may be larger than semiconductor chip 130.

Referring still to FIG. 1, the electrical coupling between semiconductor chip 130 and integrated passive component 120 may be accomplished using a wire bond 150. In the same or another embodiment, integrated passive component 120 and leadframe 110 may be electrically coupled together, and/or semiconductor chip 130 and leadframe 110 may be electrically coupled together. As an example, the electrical coupling between semiconductor chip 130 and leadframe 110 may be accomplished using a wire bond 160. As an example, the electrical coupling between integrated passive component 120 and leadframe 110 may be accomplished using an adhesive layer located between integrated passive component 120 and leadframe 110. As an example, the adhesive layer may comprise solder, conductive or non-conductive epoxy, or the like. In another embodiment, the adhesive layer may not perform an electrical coupling function, but may serve to secure integrated passive component 120 and leadframe 110 to each other. In that embodiment, the electrical coupling may instead be accomplished using a wire bond or the like. In yet another embodiment, integrated passive component 120 may be electrically coupled to leadframe 110 only through semiconductor chip 130.

Figure 2:
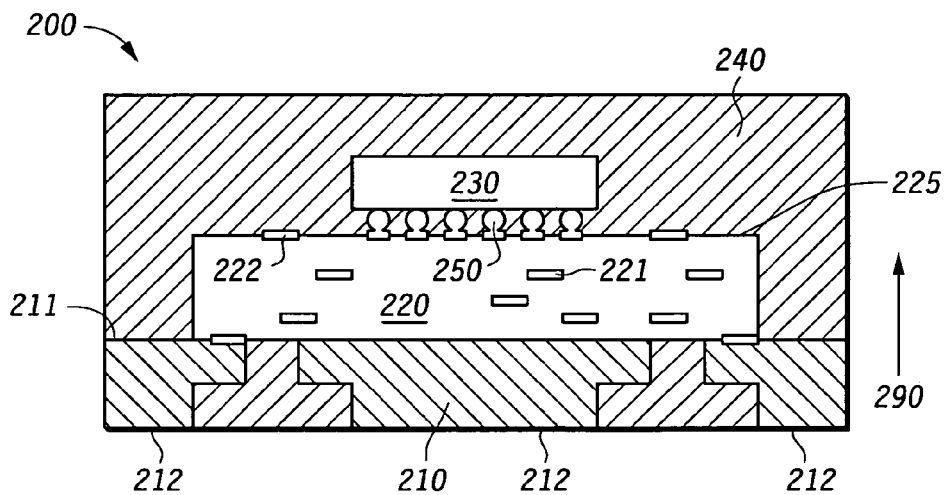
FIG. 2 is a cross-sectional view of a semiconductor component according to another embodiment of the invention.

FIG. 2 is a cross-sectional view of a semiconductor component 200 according to another embodiment of the invention. Semiconductor component 200 comprises a leadframe 210 having a surface 211, an integrated passive component 220 located above surface 211, a semiconductor chip 230 electrically coupled to integrated passive component 220 and located above surface 211, and a mold compound 240 disposed around semiconductor chip 230, integrated passive component 220, and leadframe 210. Integrated passive component 220 is located between leadframe 210 and semiconductor chip 230. A portion 212 of leadframe 210 is exposed outside of mold compound 240. Portion 212 can be used to electrically couple semiconductor component 200 to another semiconductor component, a printed circuit board, or the like. As an example, integrated passive component 220 can comprise silicon, gallium arsenide, silicon germanium, ceramic, glass, organic polymer, or the like. As a particular example, the organic polymer can be a laminated organic structure such as a printed circuit board.

As an example, leadframe 210 can be a quad flat non-leaded leadframe, a P-DIP, an SOIC, a QFP, or the like. Integrated passive component 220 comprises a passive device 221. As an example, passive device 221 can be a resistor, a capacitor, an inductor, a passive circuit, a band pass filter, or the like. In one embodiment, integrated passive component 220 comprises a multilayered structure having copper tracings forming a plurality of passive devices, including passive device 221. Semiconductor chip 230, integrated passive component 220, and leadframe 210 are arranged vertically with respect to each other, where a vertical direction 290 is defined as being substantially perpendicular to surface 211.

In one embodiment, passive device 221 may be situated such that passive device 221 is not exposed at any surface of integrated passive component 220. In another embodiment, passive device 221 may be situated such that passive device 221 is exposed at a surface of integrated passive component 220. In the same or another embodiment, integrated passive component 220 can comprise a plurality of passive devices, including passive device 221. In the embodiment illustrated in FIG. 2, passive device 221 is not exposed at any surface of integrated passive component 220, while a passive device 222 is exposed at a surface 225 of integrated passive component 220. Additional discrete passive devices may be placed on integrated passive component 220 and/or on one or more of the electrical interconnects of leadframe 210. It will be understood that the discrete passive devices may be larger than semiconductor chip 230.

Referring still to FIG. 2, the electrical coupling between semiconductor chip 230 and integrated passive component 220 may be accomplished using a flip chip interconnect 250. In the same embodiment, integrated passive component 220 and leadframe 210 are electrically coupled together, and/or semiconductor chip 230 and leadframe 210 are electrically coupled together. As an example, the electrical coupling between semiconductor chip 230 and leadframe 210 may be accomplished via the electrical coupling between integrated passive component 220 and leadframe 210. As another example, the electrical coupling between integrated passive component 220 and leadframe 210 may be accomplished using an adhesive layer located between integrated passive component 220 and leadframe 210. As an example, the adhesive layer may comprise solder, conductive or non-conductive epoxy, or the like. In another embodiment, the adhesive layer may not perform an electrical coupling function, but may serve to secure integrated passive component 220 and leadframe 210 to each other. In that embodiment, the electrical coupling may instead be accomplished using a wire bond or the like.

Figure 3:
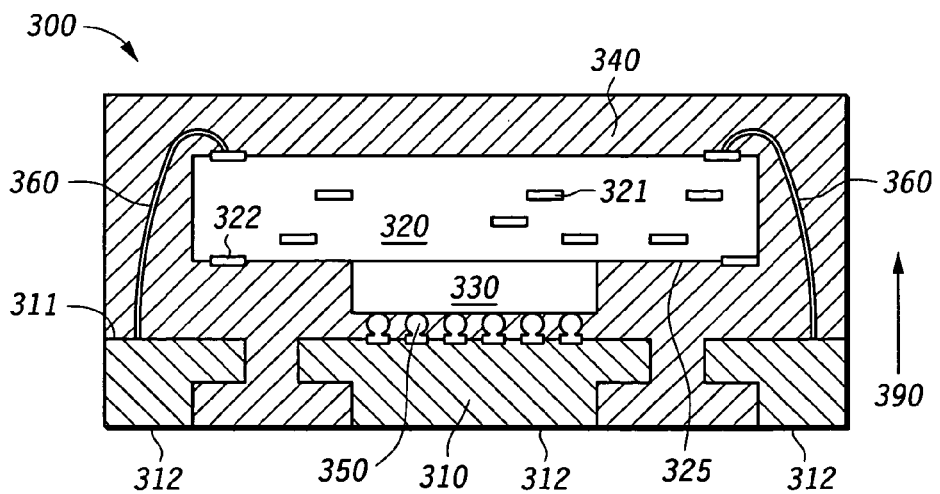
FIG. 3 is a cross-sectional view of a semiconductor component according to still another embodiment of the invention.

FIG. 3 is a cross-sectional view of a semiconductor component 300 according to another embodiment of the invention. Semiconductor component 300 comprises a leadframe 310 having a surface 311, an integrated passive component 320 located above surface 311, a semiconductor chip 330 electrically coupled to integrated passive component 320 and located above surface 311, and a mold compound 340 disposed around semiconductor chip 330, integrated passive component 320, and leadframe 310. Semiconductor chip 330 is located between integrated passive component 320 and leadframe 310. A portion 312 of leadframe 310 is exposed outside of mold compound 340. Portion 312 can be used to electrically couple semiconductor component 300 to another semiconductor component, a printed circuit board, or the like. As an example, integrated passive component 320 can comprise silicon, gallium arsenide, silicon germanium, ceramic, glass, organic polymer, or the like. As a particular example, the organic polymer can be a laminated organic structure such as a printed circuit board.

As an example, leadframe 310 can be a quad flat non-leaded leadframe, a P-DIP, an SOIC, a QFP, or the like. Integrated passive component 320 comprises a passive device 321. As an example, passive device 321 can be a resistor, a capacitor, an inductor, a passive circuit, a band pass filter, or the like. In one embodiment, integrated passive component 320 comprises a multilayered structure having copper tracings forming a plurality of passive devices, including passive device 321. Semiconductor chip 330, integrated passive component 320, and leadframe 310 are arranged vertically with respect to each other, where a vertical direction 390 is defined as being substantially perpendicular to surface 311.

In one embodiment, passive device 321 may be situated such that passive device 321 is not exposed at any surface of integrated passive component 320. In another embodiment, passive device 321 may be situated such that passive device 321 is exposed at a surface of integrated passive component 320. In the same or another embodiment, integrated passive component 320 can comprise a plurality of passive devices, including passive device 321. In the embodiment illustrated in FIG. 3, passive device 321 is not exposed at any surface of integrated passive component 320, while a passive device 322 is exposed at a surface 325 of integrated passive component 320. Additional discrete passive devices may be placed on integrated passive component 320 and/or on one or more of the electrical interconnects of leadframe 310. It will be understood that the discrete passive devices may be larger than semiconductor chip 330.

Referring still to FIG. 3, the electrical coupling between semiconductor chip 330 and integrated passive component 320 may be accomplished using an adhesive layer located between integrated passive component 320 and semiconductor chip 330. As an example, the adhesive layer may comprise solder, conductive or non-conductive epoxy, or the like. In another embodiment, the adhesive layer may not perform an electrical coupling function, but may serve to secure integrated passive component 320 and semiconductor chip 330 to each other. In this embodiment, the electrical coupling between integrated passive component 320 and semiconductor chip 330 may instead be accomplished using a wire bond via leadframe 310.

Semiconductor chip 330 and leadframe 310 may be electrically coupled together, and/or integrated passive component 320 and leadframe 310 may be electrically coupled together. As an example, the electrical coupling between semiconductor chip 330 and leadframe 310 may be accomplished via a flip chip interconnect 350. As another example, the electrical coupling between integrated passive component 320 and leadframe 310 may be accomplished using a wire bond 360. As another example, the electrical coupling between integrated passive component 320 and leadframe 310 may be accomplished via the electrical coupling between semiconductor chip 330 and leadframe 310, i.e., via flip chip interconnect 350.

Figure 4:
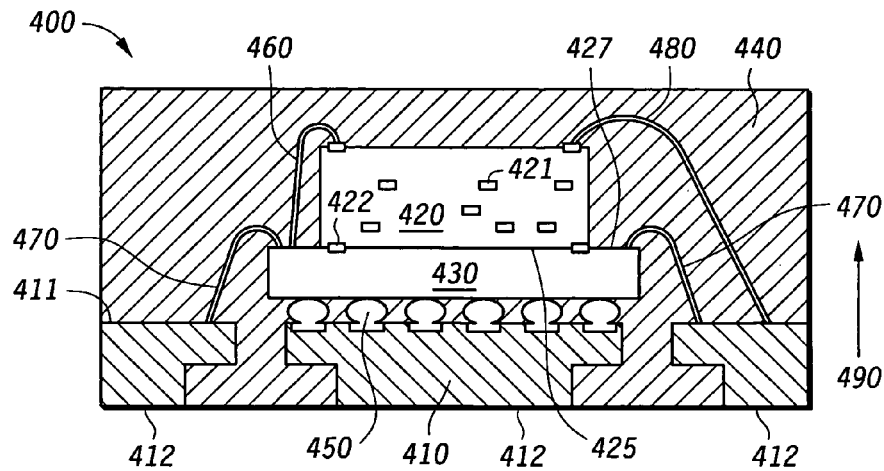
FIG. 4 is a cross-sectional view of a semiconductor component according to still another embodiment of the invention.

FIG. 4 is a cross-sectional view of a semiconductor component 400 according to another embodiment of the invention. Semiconductor component 400 comprises a leadframe 410 having a surface 411, an integrated passive component 420 located above surface 411, a semiconductor chip 430 electrically coupled to integrated passive component 420 and located above surface 411, and a mold compound 440 disposed around semiconductor chip 430, integrated passive component 420, and leadframe 410. Semiconductor chip 430 is located between integrated passive component 420 and leadframe 410. A portion 412 of leadframe 410 is exposed outside of mold compound 440. Portion 412 can be used to electrically couple semiconductor component 400 to another semiconductor component, a printed circuit board, or the like. As an example, integrated passive component 420 can comprise silicon, gallium arsenide, silicon germanium, ceramic, glass, organic polymer, or the like. As a particular example, the organic polymer can be a laminated organic structure such as a printed circuit board.

As an example, leadframe 410 can be a quad flat non-leaded leadframe, a P-DIP, an SOIC, a QFP, or the like. Integrated passive component 420 comprises a passive device 421. As an example, passive device 421 can be a resistor, a capacitor, an inductor, a passive circuit, a band pass filter, or the like. In one embodiment, integrated passive component 420 comprises a multilayered structure having copper tracings forming a plurality of passive devices, including passive device 421. Semiconductor chip 430, integrated passive component 420, and leadframe 410 are arranged vertically with respect to each other, where a vertical direction 490 is defined as being substantially perpendicular to surface 411.

In one embodiment, passive device 421 may be situated such that passive device 421 is not exposed at any surface of integrated passive component 420. In another embodiment, passive device 421 may be situated such that passive device 421 is exposed at a surface of integrated passive component 420. In the same or another embodiment, integrated passive component 420 can comprise a plurality of passive devices, including passive device 421. In the embodiment illustrated in FIG. 4, passive device 421 is not exposed at any surface of integrated passive component 420, while a passive device 422 is exposed at a surface 425 of integrated passive component 420. Additional discrete passive devices may be placed on integrated passive component 420 and/or on one or more of the electrical interconnects of leadframe 410. It will be understood that the discrete passive devices may be larger than semiconductor chip 430, and that semiconductor chip 430 may be larger than integrated passive component 420.

Referring still to FIG. 4, the electrical coupling between semiconductor chip 430 and integrated passive component 420 may be accomplished using an adhesive layer located between integrated passive component 420 and semiconductor chip 430. As an example, the adhesive layer may comprise solder, conductive or non-conductive epoxy, or the like. In another embodiment, the adhesive layer may not perform an electrical coupling function, but may serve to secure integrated passive component 420 and semiconductor chip 430 to each other. In that embodiment, the electrical coupling between integrated passive component 420 and semiconductor chip 430 may instead be accomplished using a wire bond, a flip chip interconnection, or the like. As an example, integrated passive component 420 and semiconductor chip 430 may be electrically coupled together using a wire bond 460.

Semiconductor chip 430 and leadframe 410 may be electrically coupled together, and/or integrated passive component 420 and leadframe 410 may be electrically coupled together. As an example, the electrical coupling between semiconductor chip 430 and leadframe 410 may be accomplished via a flip chip interconnect 450 and/or one or more wire bonds 470. As another example, the electrical coupling between integrated passive component 420 and leadframe 410 may be accomplished using a wire bond 480. As another example, the electrical coupling between integrated passive component 420 and leadframe 410 may be accomplished via the electrical coupling between semiconductor chip 430 and leadframe 410, i.e., via flip chip interconnect 450 and/or one or more wire bonds 470.

It will be understood by one of ordinary skill in the art that the embodiment illustrated in FIG. 4 may require a ground plane to be placed at a surface 427 of semiconductor chip 430. Surface 427 is adjacent to surface 425. The ground plane at surface 427 of semiconductor chip 430 may provide a location at which to attach wire bonds, such as wire bonds 460 and 470, to semiconductor chip 430.

Figure 5:
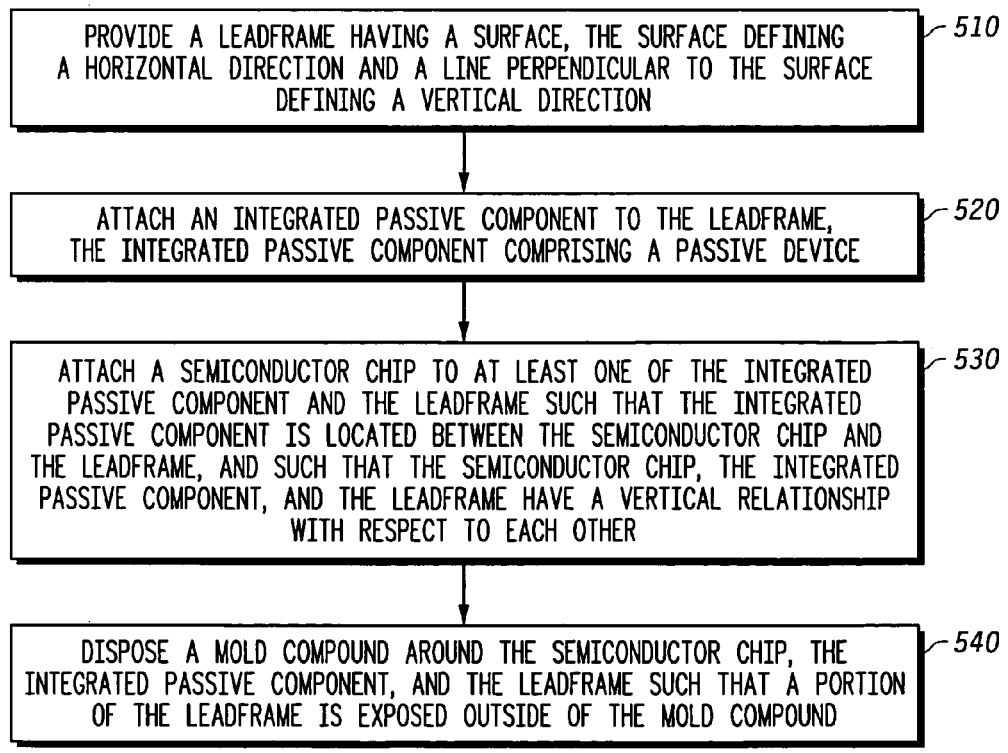
FIG. 5 is a flow chart illustrating a method of manufacturing a semiconductor component according to an embodiment of the invention.

FIG. 5 is a flow chart illustrating a method 500 of manufacturing a semiconductor component according to an embodiment of the invention. A step 510 of method 500 is to provide a leadframe having a surface, the surface defining a horizontal direction and a line perpendicular to the surface defining a vertical direction. As an example, the leadframe can be similar to leadframe 110 in FIG. 1, leadframe 210 in FIG. 2, leadframe 310 in FIG. 3, and leadframe 410 in FIG. 4. In one embodiment, step 510 can comprise providing a quad flat non-leaded leadframe.

A step 520 of method 500 is to attach an integrated passive component to the leadframe, the integrated passive component comprising a passive device. As an example, the integrated passive component can be similar to integrated passive component 120 in FIG. 1, integrated passive component 220 in FIG. 2, integrated passive component 320 in FIG. 3, and integrated passive component 420 in FIG. 4. As another example, the passive device can be similar to one or more of passive devices 121 and 122 in FIG. 1, one or more of passive devices 221 and 222 in FIG. 2, one or more of passive devices 321 and 322 in FIG. 3, and one or more of passive devices 421 and 422 in FIG. 4. In one embodiment, step 520 or another step comprises providing an adhesive layer between the integrated passive component and the leadframe and/or the semiconductor chip, and securing the integrated passive component to the leadfrarne and/or the semiconductor chip using the adhesive layer. In the same or another embodiment, the adhesive layer can electrically couple the integrated passive component to the leadframe and/or the semiconductor chip in addition to securing the integrated passive component to the leadframe and/or the semiconductor chip.

A step 530 of method 500 is to attach a semiconductor chip to at least one of the integrated passive component and the leadframe such that the integrated passive component is located between the semiconductor chip and the leadframe, and such that the semiconductor chip, the integrated passive component, and the leadframe have a vertical relationship with respect to each other. As an example, the semiconductor chip can be similar to semiconductor chip 130 in FIG. 1, semiconductor chip 230 in FIG. 2, semiconductor chip 330 in FIG. 3, and semiconductor chip 430 in FIG. 4. In one embodiment, step 530 comprises wire bonding the semiconductor chip to at least one of the integrated passive component and the leadframe. In another embodiment, step 530 comprises electrically coupling the semiconductor chip to at least one of the integrated passive component and the leadframe using flip chip interconnects.

A step 540 of method 500 is to dispose a mold compound around the semiconductor chip, the integrated passive component, and the leadframe such that a portion of the leadframe is exposed outside of the mold compound. As an example, the mold compound can be similar to mold compound 140 in FIG. 1, mold compound 240 in FIG. 2, mold compound 340 in FIG. 3, and mold compound 440 in FIG. 4.

Figure 6:
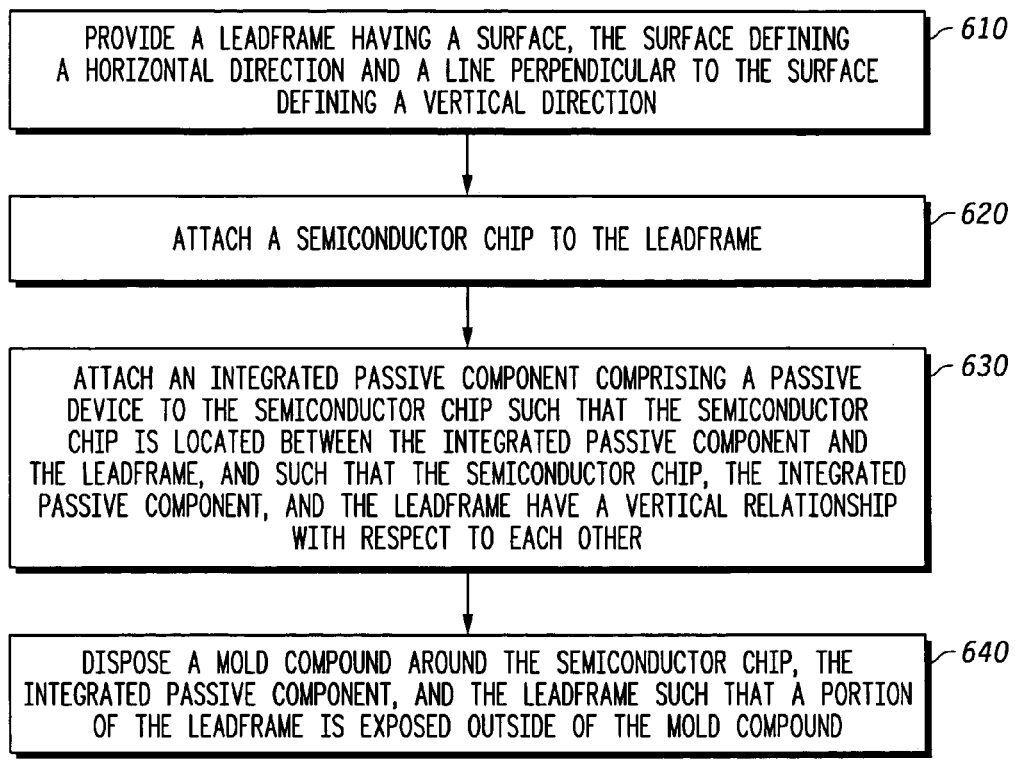
FIG. 6 is a flow chart illustrating a method of manufacturing a semiconductor component according to another embodiment of the invention.

FIG. 6 is a flow chart illustrating a method 600 of manufacturing a semiconductor component according to another embodiment of the invention. A step 610 of method 600 is to provide a leadframe having a surface, the surface defining a horizontal direction and a line perpendicular to the surface defining a vertical direction. As an example, the leadframe can be similar to leadframe 110 in FIG. 1, leadframe 210 in FIG. 2, leadframe 310 in FIG. 3, and leadframe 410 in FIG. 4. In one embodiment, step 610 can comprise providing a quad flat non-leaded leadframe.

A step 620 of method 600 is to attach a semiconductor chip to the leadframe. As an example, the semiconductor chip can be similar to semiconductor chip 130 in FIG. 1, semiconductor chip 230 in FIG. 2, semiconductor chip 330 in FIG. 3, and semiconductor chip 430 in FIG. 4. In one embodiment, step 620 can comprise electrically coupling the semiconductor chip to the leadframe using flip chip interconnects.

A step 630 of method 600 is to attach an integrated passive component comprising a passive device to the semiconductor chip such that the semiconductor chip is located between the integrated passive component and the leadframe, and such that the semiconductor chip, the integrated passive component, and the leadframe have a vertical relationship with respect to each other. As an example, the integrated passive component can be similar to integrated passive component 120 in FIG. 1, integrated passive component 220 in FIG. 2, integrated passive component 320 in FIG. 3, and integrated passive component 420 in FIG. 4. As another example, the passive device can be similar to one or more of passive devices 121 and 122 in FIG. 1, one or more of passive devices 221 and 222 in FIG. 2, one or more of passive devices 321 and 322 in FIG. 3, and one or more of passive devices 421 and 422 in FIG. 4.

In one embodiment, step 630 or another step can further comprise electrically coupling the integrated passive component to at least one of the semiconductor chip and the leadframe. As an example, the electrical coupling between the integrated passive component and at least one of the semiconductor chip and the leadframe can be accomplished using one or more wire bonds.

In the same or another embodiment, step 630 or another step comprises providing an adhesive layer between the integrated passive component and the semiconductor chip, and securing the integrated passive component to the semiconductor chip using the adhesive layer. In the same or another embodiment, the adhesive layer can electrically couple the integrated passive component to the semiconductor chip in addition to securing the integrated passive component to the semiconductor chip.

A step 640 of method 600 is to dispose a mold compound around the semiconductor chip, the integrated passive component, and the leadframe such that a portion of the leadframe is exposed outside of the mold compound. As an example, the mold compound can be similar to mold compound 140 in FIG. 1, mold compound 240 in FIG. 2, mold compound 340 in FIG. 3, and mold compound 440 in FIG. 4.

Although the invention has been described with reference to specific embodiments, it will be understood by those skilled in the art that various changes may be made without departing from the spirit or scope of the invention. Various examples of such changes have been given in the foregoing description. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the semiconductor component discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of manufacturing a semiconductor component, the method comprising:
   providing a leadframe having a surface, the surface defining a horizontal direction and a line perpendicular to the surface defining a vertical direction;
   attaching a semiconductor chip to the leadframe;
   providing an integrated passive component comprising a surface layer and an interior layer and further comprising a passive device in the interior layer;
   attaching the integrated passive component to the semiconductor chip such that:
      the semiconductor chip is located between the integrated passive component and the leadframe; and
      the semiconductor chip, the integrated passive component, and the leadframe have a vertical relationship with respect to each other; and
   disposing a mold compound around the semiconductor chip, the integrated passive component, and the leadframe such that a portion of the leadframe is exposed outside of the mold compound.

2. The method of claim 1 wherein:
providing the leadframe comprises:
   providing a quad flat non-leaded leadframe.

3. The method of claim 1 wherein:
attaching the semiconductor chip to the leadframe comprises:
   electrically coupling the semiconductor chip to the leadframe using flip chip interconnects.

4. The method of claim 1 further comprising:
electrically coupling the integrated passive component to at least one of the semiconductor chip and the leadframe.

5. The method of claim 4 wherein:
electrically coupling the integrated passive component comprises wire bonding the integrated passive component to at least one of the semiconductor chip and the leadframe.

6. The method of claim 1 further comprising:
providing an adhesive layer between the integrated passive component and the semiconductor chip; and
securing the integrated passive component to the semiconductor chip using the adhesive layer.

7. The method of claim 1 wherein:
providing the integrated passive component comprises providing a component other than a semiconductor device.

8. A method of manufacturing a semiconductor component, the method comprising:
   providing a leadframe having a surface, the surface defining a horizontal direction and a line perpendicular to the surface defining a vertical direction;
   attaching a semiconductor chip having a first surface area to the leadframe;
   attaching an integrated passive component having a second surface area to the semiconductor chip such that:
      the semiconductor chip is located between the integrated passive component and the leadframe; and
      the semiconductor chip, the integrated passive component, and the leadframe have a vertical relationship with respect to each other; and
   disposing a mold compound around the semiconductor chip, the integrated passive component, and the leadframe such that a portion of the leadframe is exposed outside of the mold compound,
   wherein:
      the second surface area is at least as large as the first surface area; and
      the integrated passive component comprises a passive device.

9. The method of claim 8 wherein:
providing the leadframe comprises:
   providing a quad flat non-leaded leadframe.

10. The method of claim 8 wherein:
attaching the semiconductor chip to the leadframe comprises:
   electrically coupling the semiconductor chip to the leadframe using flip chip interconnects.

11. The method of claim 8 further comprising:
electrically coupling the integrated passive component to at least one of the semiconductor chip and the leadframe.

12. The method of claim 11 wherein:
electrically coupling the integrated passive component comprises wire bonding the integrated passive component to at least one of the semiconductor chip and the leadframe.

13. The method of claim 8 further comprising:
providing an adhesive layer between the integrated passive component and the semiconductor chip; and
securing the integrated passive component to the semiconductor chip using the adhesive layer.

14. The method of claim 8 wherein:
providing the integrated passive component comprises providing a component other than a semiconductor device.

15. The method of claim 8 wherein:
the second surface area is larger than the first surface area.

* * * * *